United States Patent
Bao et al.

(10) Patent No.: US 6,770,549 B2
(45) Date of Patent: Aug. 3, 2004

(54) FORMING PATTERNED THIN FILM METAL LAYERS

(75) Inventors: Zhenan Bao, Millburn, NJ (US); Peter Kian-Hoon Ho, North Plainfield, NJ (US); Takao Someya, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 129 days.

(21) Appl. No.: 10/141,362

(22) Filed: May 8, 2002

(65) Prior Publication Data

US 2003/0211665 A1 Nov. 13, 2003

(51) Int. Cl.[7] .............................................. H01L 21/20
(52) U.S. Cl. ...................... 438/584; 438/597; 438/669; 438/686
(58) Field of Search ................................ 438/616, 686, 438/677

(56) References Cited

U.S. PATENT DOCUMENTS

| | | | | |
|---|---|---|---|---|
| 5,918,113 A | * | 6/1999 | Higashi et al. | 438/119 |
| 5,997,958 A | * | 12/1999 | Sato et al. | 427/468 |
| 6,239,013 B1 | * | 5/2001 | Hotchkiss | 438/616 |
| 6,436,651 B1 | * | 8/2002 | Everhart et al. | 435/7.21 |
| 6,524,889 B2 | * | 2/2003 | Ono | 438/113 |
| 6,596,569 B1 | * | 7/2003 | Bao et al. | 438/151 |
| 2002/0148113 A1 | * | 10/2002 | Forrest et al. | 29/847 |
| 2003/0010241 A1 | * | 1/2003 | Fujihira et al. | 101/483 |
| 2003/0024632 A1 | * | 2/2003 | Hahn et al. | 156/230 |
| 2003/0175427 A1 | * | 9/2003 | Loo et al. | 427/256 |

* cited by examiner

Primary Examiner—John F. Niebling
Assistant Examiner—Angel Roman

(57) ABSTRACT

The specification describes a pattern transfer technique for forming patterns of thin films of high resolution over large areas. It involves forming a pattern layer on a transfer substrate, patterning the pattern layer while on the transfer substrate, then contacting the transfer substrate with the receiving substrate. The surface of the receiving substrate is treated to activate the surface thereby improving adhesion of the transfer pattern to the receiving substrate. The activation treatment involves forming a layer of metal particles on the surface of the receiving substrate. The pattern layer is preferably of the same metal, or a similar metal or alloy, and is transferred from the transfer substrate to the receiving substrate by metallurgical bonding.

The method of the invention is particularly useful for printing metal conductor patterns (metalization), and device features, on flexible polymer substrates in, for example, thin film transistor (TFT) technology.

19 Claims, 5 Drawing Sheets

FORMING PATTERNED THIN FILM METAL LAYERS

FIELD OF THE INVENTION

This invention relates to patterning of metal films, and more particularly to patterning of metal films using surface chemistry mediated transfer processes.

BACKGROUND OF THE INVENTION

Established fine line lithographic methods (e.g., electron-beam lithography, deep ultraviolet photolithography, etc.) are widely used for patterning metal layers. These processes are mainly subtractive processes. The importance of nano-fabrication in a wide range of technologies has created substantial interest in additive techniques, such as those based on forms of contact printing, molding, embossing, and writing. Additive patterning methods are inherently simpler than subtractive techniques and the consequent potential cost benefit makes them especially attractive in the manufacture of microelectronic devices.

Recent research demonstrates that additive techniques can produce pattern resolution in the micron and nanometer regime. That makes them especially promising for forming fine metalization patterns, and small electrical circuit features, in microeletronics. Efforts to apply these techniques to the manufacture of thin film transistor (TFT) devices is a special priority.

BRIEF STATEMENT OF THE INVENTION

The invention is an additive printing method that has fine resolution. It involves forming a pattern layer on a transfer substrate, patterning the pattern layer while on the transfer substrate, then contacting the transfer substrate with the receiving substrate. The term receiving substrate is intended to mean the substrate or body where the final pattern is intended, and is typically a polymer. In one embodiment, the transfer substrate is rigid, and the receiving substrate is flexible. The receiving substrate is treated to form a metallurgical bonding layer chemically bonded to its surface. The metallurgical bonding layer comprises small particles of metal. The pattern layer is preferably of the same metal, or a similar metal or alloy, and is transferred from the transfer substrate to the receiving substrate by metallurgical bonding.

The method of the invention is particularly useful for printing metal conductor patterns (metalization) and device features on flexible polymer substrates in TFT technology.

DETAILED DESCRIPTION

For illustration, the method will be described in the context of manufacture of plastic electronic systems by fabricating drain and source electrodes and appropriate interconnects for high performance n- and p-channel organic transistors and complementary inverter circuits. The receiving substrate in this case is flexible, and preferably of a conformal elastomer material. In the illustration, the transfer substrate is rigid. Rigid transfer substrates are preferred because they facilitate formation of fine, dimensionally stable, patterns using existing well-developed patterning techniques. Alternatively, the transfer substrate may be flexible, or semi-rigid. It should be understood that the invention applies to these permutations: 1. a flexible transfer substrate with a rigid receiving substrate, 2. a flexible transfer substrate with a flexible receiving substrate, 3. a rigid transfer substrate with a flexible receiving substrate, and 4. a rigid transfer substrate with a rigid receiving substrate. For the manufacture of flexible TFT assemblies, to be described in more detail below, the combinations 2. and 3. are preferred.

Typical steps of the transfer printing method will be described with the aid of FIGS. 1–12.

Figure 1:
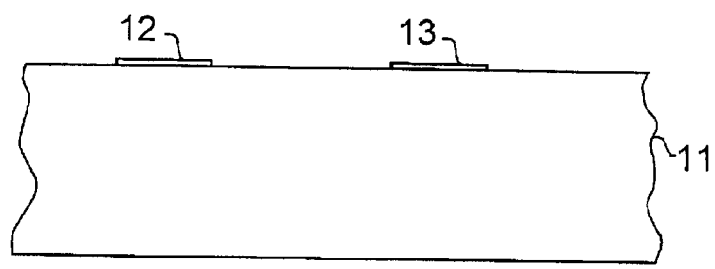
FIGS. 1–12 are schematic representations of process steps useful for forming thin patterned metal layers using the method of the invention.

FIG. 1 shows the objective of this example. Flexible polymer substrate 11 is shown with source and drain electrodes, 12 and 13, formed on the surface of the substrate by transfer printing. These electrodes are shown by way of example. Other TFT features can be produced by the method of the invention, or other metallized patterns useful in a wide range of applications, as described earlier. FIG. 1, and subsequent figures, show a view with only source and drain contacts. It will be understood that suitable metalization interconnecting the source and drain is provided. Typically the interconnections will be part of the same metal pattern as that shown.

Figure 2:
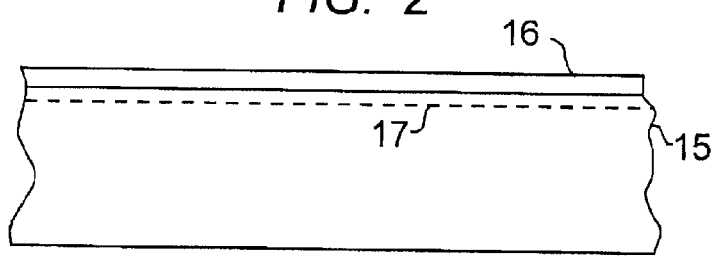

The transfer substrate is formed by depositing a metal layer on the surface of the transfer substrate. With reference to FIG. 2, the transfer substrate is shown at 15 and the metal transfer layer at 16. The material of the rigid substrate 15 may be selected from a wide variety of compositions. Suitable substrates are ceramic, such as alumina, berlylia, barium titanate, semiconductors, such as silicon, gallium arsenide, or refractory oxides or nitrides, such as silicon dioxide, titanium dioxide, tantalum oxide, tantalum nitride, silicon nitride. Also suitable are oxide layers or nitride layers on metals or semiconductors, for example, $SiO_2$ on Si. The transfer layer is preferably a metal such as Au, Ag, Pt, Pd, Co, Ni, Al, Ti, Ta. The substrate materials should be chosen to have relatively poor adhesion with these metals. Therefore the transfer substrate and the transfer layer are preferably not the same material. In some cases it may be desirable to pre-treat the substrate 15, prior to depositing metal layer 16, to alter the adhesion characteristics at the interface. This is represented in FIG. 2 by dashed line 17. A variety of coatings may be applied to this surface to reduce adhesion of the metal layer to the substrate. A suitable class of materials are fluorocarbons. An example is Teflon or monolayer contains fluorinated surface.

The thickness of the metal transfer layer is chosen to be the thickness of the pattern desired on the receiving substrate. Thus in the case of the example of FIG. 1, the thickness of layer 22 (FIG. 2) may be in the range 0.02–100 microns. In TFT technology, the metal patterns are typically in the range 0.05 to 2 microns in thickness, and for flexible TFT applications, less than 1 micron is preferred.

It should be understood that the elements shown in the figures are not to scale. The thickness of the transfer layer and other elements in these figures is shown exaggerated for clarity. These layers are thin films, as evident from the overall description, that do not interfere with effective lamination of substrates together as will described.

The metal layer 16 is then patterned to form the metal pattern desired on the receiving substrate. An advantage of having a rigid substrate or substrate layer at this point is that it is dimensionally stable and can be patterned with high precision using standard patterning techniques, for example lithography. Electron beam lithography, x-ray lithography or photolithography may be used.

The pattern is typically characterized by features in the range 0.05–100 µm, in fine patterns below 20 microns, and edge resolution of better than 100 nm., in fine patterns, edge resolution better than 150 angstroms.

Figure 3:
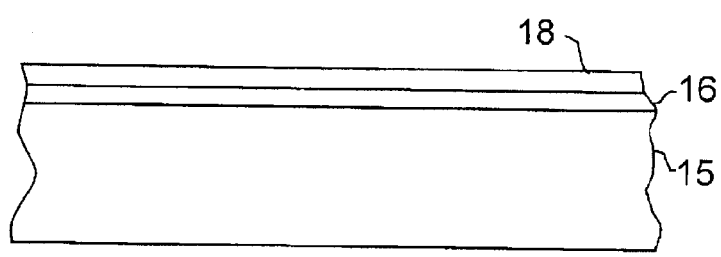
Figure 4:
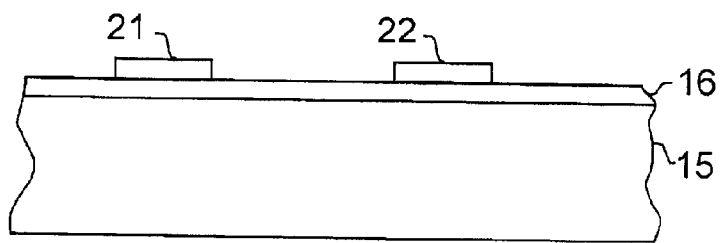
Figure 5:
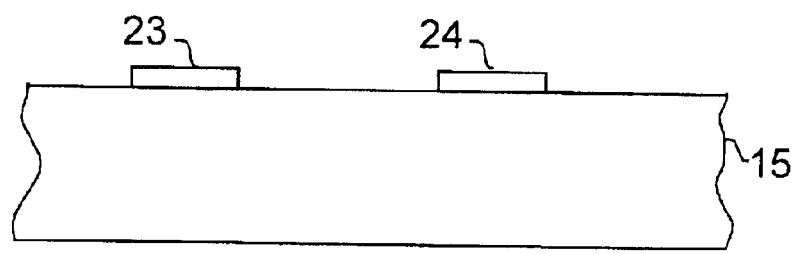

For illustration, FIG. 3 shows a photoresist layer 18 spun coated on the surface of metal layer 16. The photoresist is patterned and developed using conventional methods to produce mask features 21 and 22 shown in FIG. 4 corresponding, in this example, to the source and drain contacts. The exposed portions of the metal layer are etched away using conventional etch methods, wet or dry, to produce the structure shown in FIG. 5, where metal features 23 and 24 are supported by, and loosely adherent to, transfer substrate 15.

The transfer substrate may be provided with a raised pattern, i.e. embossed, in the manner described in co-pending application Ser. No. 10/098,201, filed Mar. 15, 2002, which application is incorporated herein by reference.

The flexible receiving substrate will usually be a polymer, and preferably is an elastomer. An example is poly (dimethysiloxane) (PDMS). For more details on suitable materials useful in this invention and their properties reference is made to co-pending application Ser. No. 10,098,202 filed Mar. 15, 2002, which application is incorporated herein by reference.

The substrate is shown here as a single layer of elastomer. For handling, and for added rigidity that may be desired for handling, the elastomer body may be attached to a flexible polymer substrate such as of poly(ethylene terephthalate) (PET). A suitable range for the overall thickness of the elastomer layer is 0.5 to 100 microns. The backing layer, e.g., PET, may have a thickness in the range 50–500 microns.

As mentioned above, an aspect of the invention is to provide a metal coating 16 that adheres only moderately to the surface of the transfer substrate 15, so that it adheres during handling, but is easily released later on. One such coating is gold, which adheres poorly to, for example, GaAs or glass. Accordingly, gold is preferred as the metal being transferred. However as mentioned earlier, with appropriate selection of materials, and/or treatment of the transfer substrate surface, a variety of other materials may be used. Composite layers may also be used. The material that contacts the transfer substrate, referred to in this context as the primary layer, preferably has relatively low affinity for the substrate material. A second layer may coat the primary layer. The second layer preferably has relatively high affinity for the material of the receiving substrate. Alternatively, a composite layer may comprise a primary coating of a material with high affinity for the material of the transfer substrate, and lower affinity for the material of the second layer of the composite. In this case the primary layer is not transferred to the receiving substrate.

One of the problems in implementing transfer of metal patterns in the manner just described is that several metals that are desirable for conductor patterns have poor adhesion to many polymer materials. For example, gold adheres relatively poorly to elastomer materials such as PDMS. To overcome that, according to one aspect of the invention, the surface of the polymer is treated to disperse small particles of metal on the polymer surface. Prior to depositing the particles, the surface of the polymer is activated so that, when applied, the particles bond to the polymer surface by a chemical reaction. Activation in this context means forming surface reactants that will produce a chemical bond by a chemical reaction with surface species on the particles.

Figure 6:
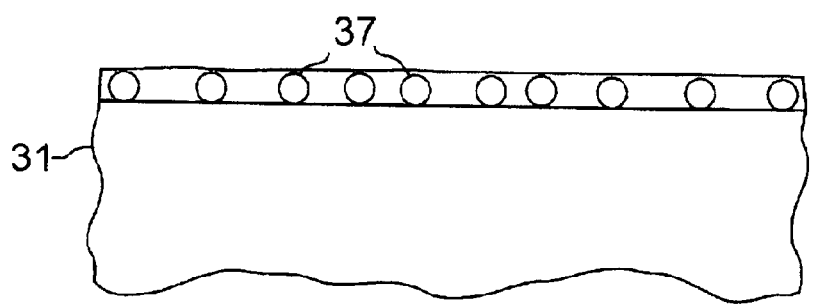

The surface treatment is represented in FIG. 6, where the polymer substrate 31 has a layer sparse dispersion of small gold particles 37 that enables a metallurgical bonding layer. The dispersion is sparse so that the particles do not form a continuous mono- or multi-layer that would be capable of carrying electric currents between different points on the surface of substrate 33. The term metallurgical bonding in this context means the joining of two metal objects, i.e. a metal particle and a metal layer.

Figure 7:
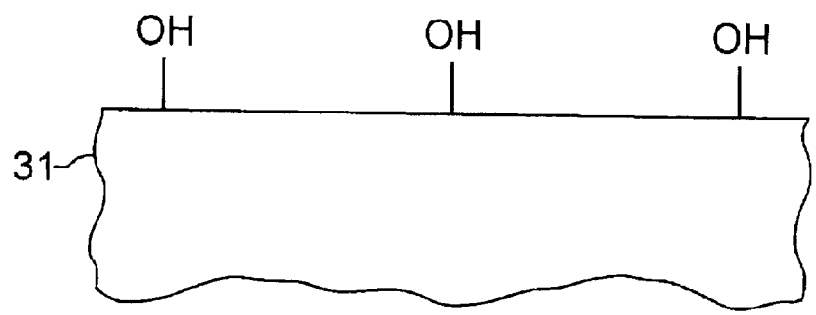

The surface treatment involves activating the surface of the polymer substrate 31. This may be achieved, for example, by treating the polymer in a basic solution of 20% KOH in water at 80° C. for 1 minute. This results in the formation of hydroxyl (—OH) groups on the surface as shown in FIG. 7. Various options are known by those skilled in the art for achieving the same result. For example, treatment in an oxygen plasma, with subsequent exposure to air, is suitable for activation.

Figure 8:
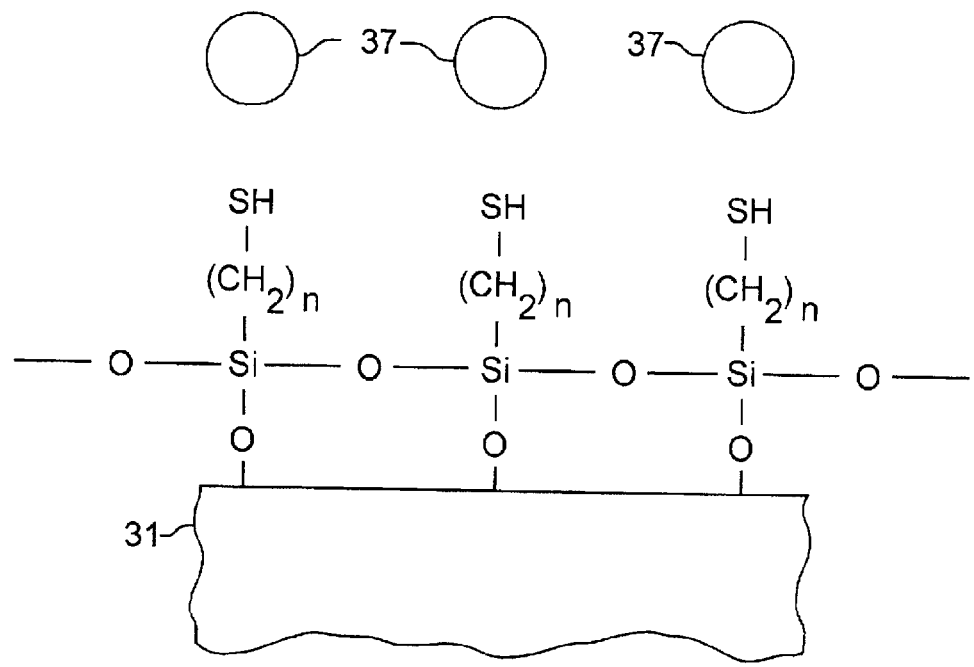
Figure 9:
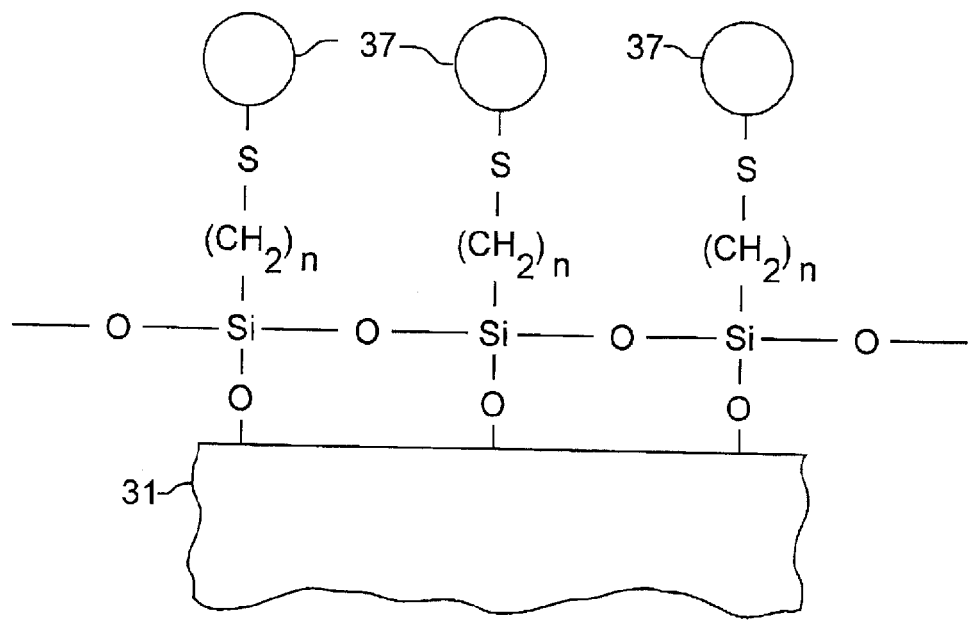

As illustrated in FIG. 8, the surface of polymer substrate 31 is then treated with a molecular unit having at least one thiol moiety to form thiol groups on the substrate surface. A preferred choice for the molecular unit is a mercaptosilane. For simplicity, this figure shows simple mercaptosilane as the molecular unit to illustrate the basic chemistry desired. However, in one embodiment used to demonstrate the invention the mercaptosilane was mercaptopropyltriethoxysilane (1% in absolute ethanol at reflux, 10 min).

The particles 37 are preferably in a colloidal suspension. Average particle diameter of the particles in colloidal suspension is less than 1 micron, and preferably less than 100 nm. The colloidal treatment used in the example was 200 min. immersion of the substrate in a colloidal suspension of 6 nm diameter gold particles in water. This binds the particles 37 to the substrate 31 with sulfur-gold bonds as illustrated schematically in FIG. 9. The dispersion of gold particles 37 on the surface has an average inter-particle spacing of at least half the average particle diameter of the particles so that, on average, the particles do not touch and do not create current paths on the substrate surface.

Figure 10:
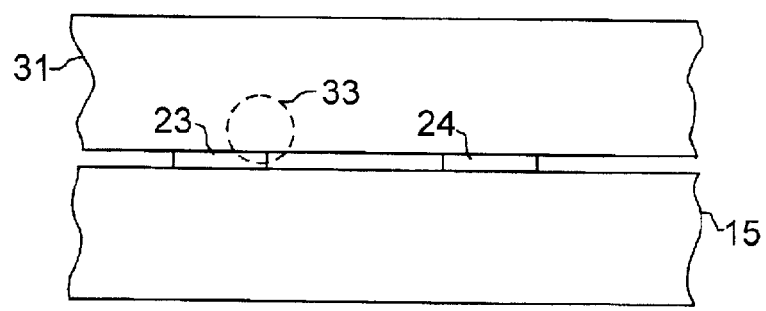
Figure 11:
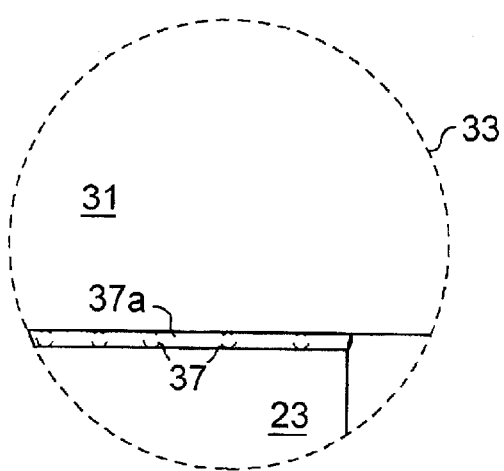

The substrate 31, with the metallurgical bonding dispersion comprising gold particles 37, is then pressed against the transfer substrate 15 as shown in FIG. 10. Contact may be accompanied by 1 to $10^3$ psi pressure. The particles 37 that comprise the metallurgical bonding layer bond the polymer substrate 31 to the gold transfer pattern 23, 24, forming a metallurgical bond between the transfer pattern and the bonding dispersion of gold particles. This is represented schematically in FIG. 11 where the particles 37 are contained in the bonding dispersion 37a. Lifting the polymer substrate 31, as illustrated in FIG. 12, completes transfer of the pattern from the transfer substrate 15 to the receiving substrate 31.

Figure 12:
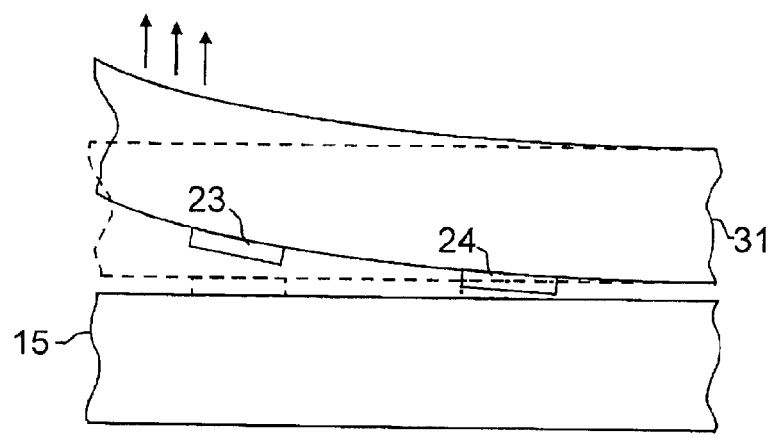

The conformal substrate, 31 in FIG. 12, is adapted for use in a TFT laminated plastic circuit. For this application, substrate 31 may consist of a thin film of PDMS (10–50 µm thick) cast on 6 sheets of poly(ethylene terephthalate) (PET; 175 µm thick). See application Ser. No. (Bao 26-1-37) referenced earlier. To demonstrate this, features of Au on PDMS/PET were formed in the geometry of the drain and source level of TFT transistors in the manner described above. A TFT device may be fabricated by laminating the substrate 31 against a similar substrate (PDMS/PET) that contains the remaining elements of the TFT, i.e. the gate structure and the semiconductor layer. Other active circuit components may be formed between the plies of the laminate in a similar manner.

Figure 13:
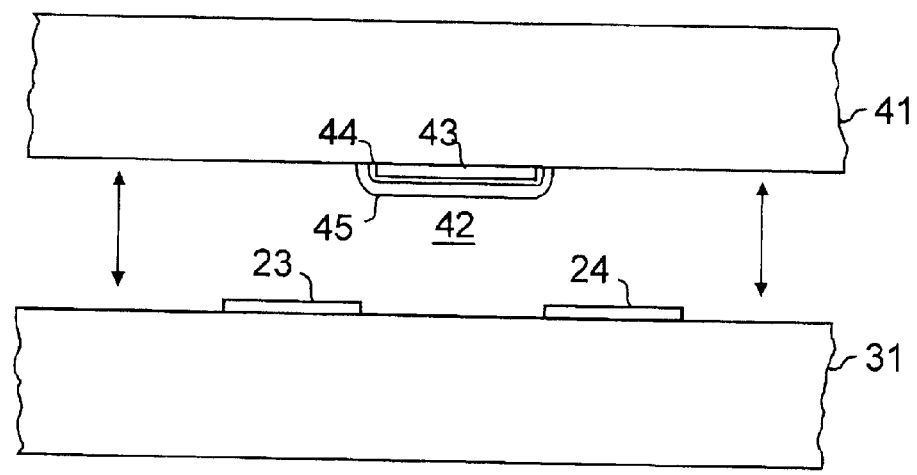
FIGS. 13 and 14 illustrate a lamination process using substrates formed by the method of the invention.
Figure 14:
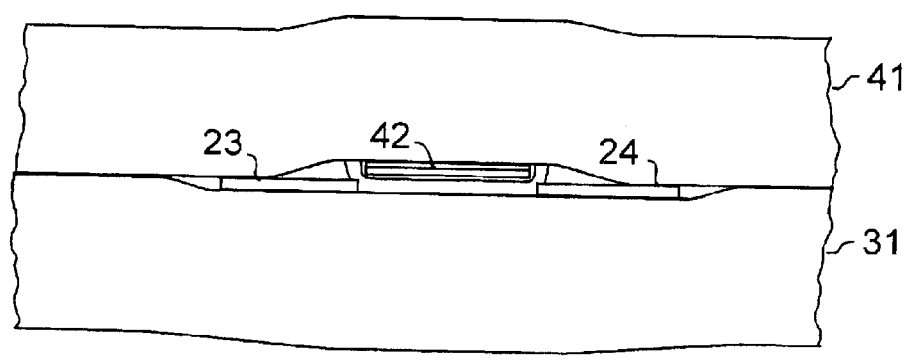

FIG. 13 illustrates the laminating operation. Substrate 41 supports the gate structure of the TFT, shown generally at 42. The gate structure includes the metal gate electrode 43, the gate dielectric 44, and a semiconductor layer 45. These elements are well known and need not be described in detail. As shown in FIG. 14, the two substrates 31 and 41 are laminated together by moderate pressure as described in more detail in the application referenced above. Initiating contact at an edge by slightly bending one of the substrates, and then allowing contact to proceed gradually across the circuit provides a convenient way to laminate over large areas without creating trapped air pockets.

A useful aspect of this lamination process is that the top substrate establishes conformal, atomic-scale contact with the bottom substrate over most of the interface, except for the actual relief features of the TFT elements. A layer of PDMS elastomer on the surface of either or both of substrates 31 and 41 acts as the solid adhesive polymer layer in this process. It 'wets' the mating substrate to enable intimate contact without the use of external pressure to force the two parts together. The lamination step also produces the circuit and simultaneously embeds it between the two sheets of PET without the use of conventional adhesives, and without the use of high temperatures.

It will be recognized by those skilled in the art that the layer of metal particles, if continuous and sufficiently thick, would form a conductive sheet over the entire surface and short elements of the metal pattern together. In practice, it is relatively easy to apply the layer of colloidal particles to avoid this. The density of particles is typically too small to provide an electrical path over the surface. Such a layer is defined in this context as not continuous electrically.

While the transfer technique of the invention is particularly suited for the manufacture of TFT devices, a wide variety of microdevices may be produced using these transfer techniques. For example, capacitors, inductors, LC circuits, and any kind of device using metalization patterns for interconnection, may take advantage of the invention.

The foregoing description focuses on printed elemental metal patterns. Patterns of metal alloys may also be printed using the techniques of the invention. Alloy metal layers may be produced by a variety of techniques such as co-sputtering or co-evaporation.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for forming a thin film metal pattern on a polymer substrate by transferring the metal pattern from a transfer body to the polymer substrate the method comprising:

forming the metal pattern on the transfer body,
forming a liquid dispersion of particles bonded to the substrate,
the particles capable of chemically bonding to the metal pattern,
pressing the transfer body and the substrate together,
removing the transfer body from the substrate leaving the metal pattern chemically bonded to the substrate.

2. The method of claim 1, wherein on average the particles do not touch one another.

3. The method of claim 2, wherein the average distance between the particles is at least half the average diameter of the particles.

4. The method of claim 2 wherein the substrate is able to conform to a surface relief in response to being pressed against a surface relief.

5. The method of claim 2 further comprising the step of laminating the substrate to a second substrate to form a circuit with active components.

6. The method of claim 5 wherein the laminating forms at least one transistor by positioning two portions of the pattern adjacent a semiconductor channel on the second substrate.

7. The method of claim 4 wherein the forming comprises:
chemically bonding the particles to a surface of the polymer substrate.

8. The method of claim 4 wherein pressing the transfer body and the substrate together forms a metallurgical bond between the metal pattern and the layer of particles.

9. The method of claim 7 wherein the chemically bonding comprises forming (—OH) moieties on the surface and reacting thiol molecular units having silane moieties with a portion of the (—OH) moieties to bond the units to the surface.

10. The method of claim 9 wherein at least some of the particles chemically bond to at least some of the thiol moieties.

11. The method of claim 10 wherein the thiol molecular units comprise mercaptosilanes.

12. The method of claim 7 wherein the chemically bonding comprises applying a colloidal solution comprising the particles to the surface.

13. The method of claim 12 wherein the particles in the colloidal solution have an average diameter of less than 1 micron.

14. The method of claim 4 wherein the polymer substrate is PDMS.

15. The method of claim 4 wherein the pattern of metal comprises gold.

16. The method of claim 13 wherein the particles comprise gold particles.

17. The method of claim 1 comprising the step of treating the substrate to activate the substrate.

18. The method of claim 17 wherein the substrate is activated by exposing the surface of the metal transfer layer to an oxygen plasma.

19. The method of claim 17 wherein the substrate is activated by exposing the substrate to an oxygen plasma.

* * * * *